United States Patent [19]

Leach et al.

[11] 4,176,289
[45] Nov. 27, 1979

[54] DRIVING CIRCUIT FOR INTEGRATED CIRCUIT SEMICONDUCTOR MEMORY

[75] Inventors: George S. Leach; Timothy R. O'Connell, both of Phoenix, Ariz.

[73] Assignee: Electronic Memories & Magnetics Corporation, Encino, Calif.

[21] Appl. No.: 918,394

[22] Filed: Jun. 23, 1978

[51] Int. Cl.² .................. H03K 17/12; H03K 17/04; H03K 17/60; H03K 3/353
[52] U.S. Cl. .................................. 307/270; 307/246; 307/251; 307/DIG. 4
[58] Field of Search ............... 307/205, 214, 251, 270, 307/DIG. 1, DIG. 4

[56] References Cited

U.S. PATENT DOCUMENTS

| Re. 27,305 | 3/1972 | Polkinghorn et al. | 307/DIG. 4 X |
|---|---|---|---|
| 3,714,466 | 1/1973 | Spence | 307/DIG. 4 X |
| 3,740,660 | 6/1973 | Davies, Jr. | 307/DIG. 4 X |
| 3,742,260 | 6/1973 | Boudry | 307/DIG. 4 X |
| 3,769,528 | 10/1973 | Chu et al. | 307/DIG. 4 X |
| 3,889,135 | 6/1975 | Nomiya et al. | 307/DIG. 4 X |
| 3,937,983 | 2/1976 | Reed | 307/DIG. 4 X |
| 3,938,108 | 2/1976 | Salsbury et al. | 307/DIG. 4 X |
| 3,988,617 | 10/1976 | Price | 307/DIG. 4 X |
| 4,071,783 | 1/1978 | Knepper | 307/251 X |
| 4,093,875 | 6/1978 | Knepper | 307/DIG. 4 X |

FOREIGN PATENT DOCUMENTS 503353  7/1976  U.S.S.R. .................. 307/DIG. 4

Primary Examiner—Larry N. Anagnos
Attorney, Agent, or Firm—Kleinberg, Morganstern, Scholnick & Mann

[57] ABSTRACT

An improved driving circuit is provided especially for use in an integrated circuit semiconductor memory which operates on low power supply voltage, such as 5 volts, the drive circuit employing field effect transistors coupled with bootstrap capacitor devices and responsive to an input pulse for supplying, at its output terminal, a pulse having a peak voltage potential substantially equal to the power supply voltage value despite the inherent threshold voltage drops of the field effect transistors utilized. In the drive circuit, in response to an input pulse, the reference voltage for charged capacitor devices is switched between a first level and a raised second, higher level to place the capacitor devices in series with each other and the raised reference voltage to overdrive an output switch device so as to connect substantially its full power supply voltage to its output terminal during a corresponding output pulse.

5 Claims, 3 Drawing Figures

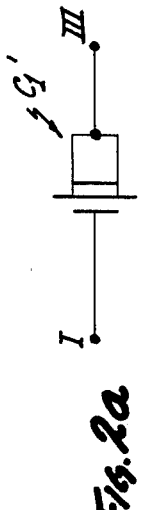
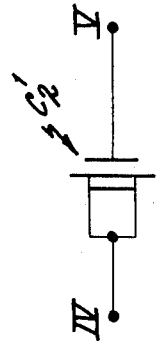
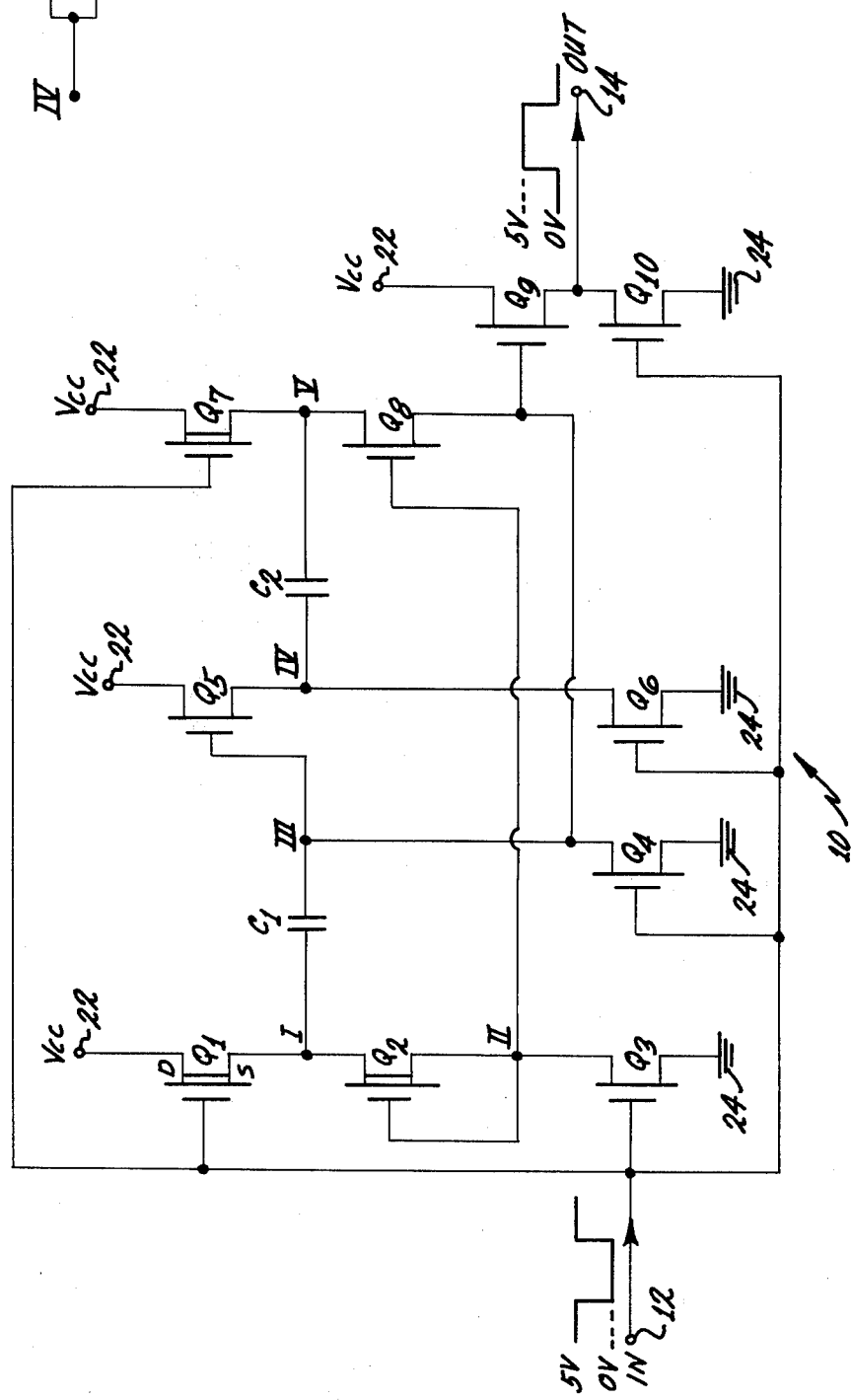

DRIVING CIRCUIT FOR INTEGRATED CIRCUIT SEMICONDUCTOR MEMORY

INTRODUCTION

Large scale semiconductor memories established on the substrate of a single semiconductor wafer or chip have rapidly achieved popularity in computer and other data processing applications. These memories may employ large numbers of field effect devices formed on the substrate surface by conventional processing techniques and can be configured into, among other things, random access memory devices having high speed, rapid access time, non-destructive readout and low power dissipation. Frequently, necessary drive circuitry, made up of the same types of field effect devices, is also included on the single chip to, for example, drive the access gates of the memory cells or reset voltages of the memory nodes or drive intermediate clock circuitry.

In the prior art, semiconductor memories conventionally operated with a single 12 volt power supply to both the memory circuits and their drive circuits. In recent years, designers of memories and other semiconductor circuits, ever mindful or reducing power requirements, have developed memory circuits which can operate at very much lower voltage levels, such as, for example, 5 volts. In order to reliably drive these memory circuits, it is important that the drive circuits (such as a chip enable buffer circuit, for example) produce output drive pulses which have substantially the full (5 volt) range of the power supply voltages, despite the threshold voltage drops of the field effect transistors which make up the drive circuit.

Although threshold voltage values of field effect transistors can be reduced to some extent by variations in the process of formation of the FET's, such reductions in threshold values are quite limited, and it is desirable to have reliable drive circuits which can produce full output despite threshold drops, and which yet utilize a minimal number of devices so as to conserve surface area of the substrate for use by memory cells.

Prior art buffer drive circuits have been very complicated, employing relatively large numbers of devices, and having relatively slow rise times in their output signals. Thus, for example, a prior art 12 volt buffer drive circuit marketed by Applicants' Assignee utilizes 14 enhancement mode devices, 5 capacitor devices, 6 resistor devices, (and no depletion mode devices, whether conductive or switched) combined in an extremely complex multiple bootstrapping arrangement with individual bootstrapping of each stage. The 12 volt buffer circuit, because of its internal complexity and limited available charging voltage (because of threshold voltage drops of the enhancement devices utilized) has a relatively slow output rise time.

SUMMARY OF THE INVENTION

In accordance with a preferred embodiment of the invention, a buffer drive circuit is provided which can be utilized as a chip enable buffer drive circuit in a semiconductor memory receiving supply voltages, such as 5 volts and 0 volts. In response to a first input signal, the drive circuit provides an output which is substantially at the common (0 volt) reference potential and, in response to a second input signal, provides an output which is substantially at the other (5 volt) reference potential. In the drive circuit, a pair of bootstrap capacitor devices (which function effectively as capacitors) are each initially charged by switchable depletion mode devices to substantially the full 5 volt level of the 5 volt power supply. This can be done because the switched depletion mode charging devices do not subtract any significant threshold voltage drop from the 5 volt supply in charging the capacitor devices. When the second input signal is applied (ordinarily as an input pulse), the point of reference of the effective capacitors is changed to have one of the capacitors provide a temporarily higher (single bootstrapped) supply voltage to portions of the drive circuit.

In addition, the capacitors are so arranged in the drive circuit that, in response to the second input signal, the power supply voltage of 5 volts is additively combined with the stored voltages in the two capacitors to apply a total fast rising, overdriving voltage (double boot-strapped voltage) of approximately 15 volts to the gate of a switching device in the output portion of the drive circuit, which then switches a voltage of approximately 10 volts and applies it to the gate of an output FET, which is thereby overdriven to connect and apply substantially the full 5 volt power supply voltage to the output of the drive circuit.

The drive circuit makes ingenious use of positive feedback transitioning to positive regenerative feedback to accomplish its described operations with minimal numbers of individual field effect transistors. In a preferred embodiment of the invention, the drive circuit is constructed with merely 7 enhancement type FET's, two switched and one non-switched depletion FET's, and two capacitor devices. Preferably, the capacitor devices are each provided as a depletion mode FET with the gate electrode serving as one node of the effective capacitor and interconnected source and drain (together with the substrate channel between them) serving as the other node of the effective capacitor.

The novel features which are believed to be characteristic of the invention, both as to organization and method of operation, together with further objects and advantages thereof will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a circuit diagram of a buffer drive circuit according to the invention;

FIG. 2a is a diagram of a preferred embodiment of capacitor device C1 shown in FIG. 1; and FIG. 2b is a diagram of a corresponding embodiment of capacitor device C2 shown in FIG. 1.

DETAILED DESCRIPTION

FIG. 1 is a circuit diagram of a preferred embodiment of a buffer drive circuit 10 according to the present invention. As illustrated, the drive circuit, which may be formed on the substrate surface of a memory wafer, utilizes a normally conductive depletion mode field effect device Q2, which functions as a load resistor, and two other input switched depletion mode devices Q1 and Q7 which function in part as switchable charging sources for capacitor devices, with the remaining switching devices Q3, Q4, Q5, Q6, Q8, Q9 and Q10 being enhancement type devices. Two capacitor devices C1 and C2 are utilized, which function as effective capacitors and are shown in FIG. 1 by the ordinary capacitor symbols for purposes of facilitating understanding of circuit operation. Preferred embodiments of capacitor devices C1 and C2, suitable for formation on a substrate surface, are shown respectively in FIGS. 2a and 2b.

For ease in description, the solid state devices utilized, which may be insulated gate field effect transistors (igfets), are identified by symbols Q1 through Q10 inclusive. Various junctions and nodes within the circuit, identified for ease in explaining the operation, have been given Roman numerals for ready reference.

As shown in FIG. 1, a buffer drive circuit 10 has an input terminal 12 and an output terminal 14. In the input stage, three serially connected field effect transistor devices are shown identified as Q1, Q2, and Q3. The drain of Q1 is connected to a supply point 22 of voltage potential Vcc which, in the present example, is nominally 5 volts.

The source of Q3 is connected to the common reference potential, here indicated by the conventional ground symbol 24. The gate of Q3 is connected to input terminal 12 to be switched by the input signals applied thereto. Q1 and Q2 have their source and drain respectively connected at a junction I and, similarly, Q2 and Q3 have their source and drain respectively connected at a junction II.

An intermediate stage switch Q4 has its gate coupled to the input terminal 12 and is connected between the common or ground potential supply point 24 and a junction III. A first bootstrap capacitor device C1 is connected between junction I and junction III. Connected to junction III is the gate of a bootstrap switch Q5 whose drain is connected to the positive potential supply point 22 and whose source is connected to the drain of a transistor Q6, whose source is connected to the common reference 24. The gate of Q6 is also connected to the input terminal 12.

The transistor Q5 and the transistor Q6 are connected at junction IV. A pair of serially connected, final stage transistors Q7 and Q8 are joined at a junction V, connecting the source of Q7 and the drain of Q8. The drain of Q7 is coupled to the potential supply point 22, and the gate of Q7 is connected to input terminal 12. The bootstrap capacitor device C2 is connected between junction IV and junction V.

The gate of transistor Q8 is connected to junction II, and the source of the transistor Q8 is connected to the gate of an output switch Q9 whose drain is connected to the Vcc potential supply point 22. The source of Q9 is serially connected to an output switch Q10 whose source is connected to the common 24 and whose gate is connected to the input terminal 12. The output terminal 14 of the drive circuit 10 is connected to the source and drain respectively of transistor Q9 and Q10. The input to the gate of Q9 is taken from the drain of Q4, which is therefore coupled to the source of Q8 and to junction III.

Basically, drive circuit 10 operates as a power and current amplifying inverter which responds to alternating high and low level signals at its input terminal 12 to provide respectively corresponding, relatively low and high level output signals at its output terminal 14. To clarify the operation, the operation of the circuit will be described in the quiescent or "off" condition and then in the "on" or "active" condition.

Considering first the quiescent state of the drive circuit, a high level (5 volt) input signal applied at the terminal 12 is sufficient to render conducting the transistors coupled to the input line, namely transistors Q3, Q4, Q6 and Q10 and transistors Q1 and Q7. Note that the depletion mode devices Q1 and Q7 are rendered conductive because the +5 volt input signal constitutes a conductively biasing gate-to-source voltage for these depletion mode devices, which have a threshold or cut off voltage of approximately −2 volts. Q2, which is a depletion mode device (with interconnected gate and source) functioning as a load resistor, is always conducting as a part of the load circuit of Q3, remaining conductive because it has at all times gate to source voltage of 0 volts, which is well above the approximately −2 volts threshold of this depletion mode device.

Because the transistor Q4 is conducting or "on," a relatively low voltage (near 0 volts) is applied through it from ground or common to the gate of Q9 which maintains Q9 in the "off" condition. Nodes II, III, and IV are thus brought and maintained at a substantially low potential (near 0 volts).

The relatively low voltage at junction II may be approximately +0.2 volts, while the voltage at junctions III and IV may be substantially at ground or 0 volts. The low voltage at junction II effectively maintains the Q8 transistor in the "off" condition.

Junctions I and V, as a result of the conductive states of the transistor Q1 and transistor Q7, are at a voltage approximately equal to the drain potential 22, nominally 5.0 volts. Q5 and Q8 are both biased "off" by the relatively low potential which is applied to their respective gates through Q4 and Q3 respectively.

As stated, because Q1 and Q7 are switched conducting, junctions I and V are approximately at the 5 volt level of the 5 volt Vcc power supply. A potential difference then exists across each of the bootstrap capacitors C1 and C2, and they are each then charged to approximately 5.0 volts. Thus, for example, referring to C1, one of its nodes is connected to junction I (approximately at 5.0 volts) while its other node is connected to junction III (approximately at 0 volts), so that C1 has approximately 5.0 volts charging voltage across it. Capacitor device C2 similarly is subjected to a 5.0 volt charging potential between junctions IV and V.

To recapitulate, in the "off" or "quiescent" state resulting from a relatively high voltage signal being applied to the input terminal 12, the circuit 10 provides a substantially ground output signal at the output terminal 14 from the drain of the "on" transistor Q10. The bootstrap capacitor devices C1 and C2 are each charged to approximately 5.0 volts. Transistors Q1, Q2, Q3, Q4, Q6, Q7 and Q10 are "on" or conducting. Transistors Q5, Q8 and Q9 are "off" or non-conducting. Note that depletion mode transistor Q2 is acting as a load resistor between junctions I and II, thus permitting different voltages (5.0 volts and 0.2 volt, respectively) to exist at these junctions, thus maintaining node I high, while simultaneously holding Q8 "off." Assuming a +5.0 volt supply, there is at junction I a potential of approximately 5.0 volts. Similarly, junction V will also be at approximately 5.0 volts. Junction II, which is at the source of the depletion device Q2, is at approximately 0.2 volt. Junctions III and IV are substantially at ground inasmuch as there is a path to ground and substantially no conductive path to Vcc from the drains of Q4 or Q6. The voltage difference of approximately 5.0 volts across each of the bootstrap capacitor devices C1 and C2 causes each of these capacitor devices to be charged to approximately 5.0 volts.

In order to place the circuit in its second or "on" state, a relatively low voltage (approximately 0 volts) may be applied to the input terminal 12. This immediately switches "off" transistors Q3, Q4, Q6 and Q10 and also depletion mode devices Q1 and Q7. This permits junction II to rise in voltage towards 5.0 volts. As the voltage at junction II rises, it turns on transistor Q8. This causes junction V, which is at 5.0 volts, to be connected through Q8 to junction III, which is at 0 volts, so that junction III will start to rise towards 5.0 volts. As junction III starts to rise, this turns on Q5 which causes junction IV to rise toward the +5.0 volts of Vcc. The rising voltage at junction IV raises the base reference potential of the bootstrap capacitor devices C1 and C2, thereby pushing up and further elevating the voltage at junctions V and I through capacitor devices C2 and C1, respectively. The pushed up increased voltage at junction I also causes junction II to rise further because of the conductive connection through depletion device Q2. This, in turn, raises the potential at the gate of Q8, further turning on Q8 and raising the voltage still further at junction III, which in turn causes Q5 to further raise the potential at junction IV.

Q5 although biased conductive, does not have a direct conductive path to ground and accordingly at equilibrium, junction IV rises a full 5 volts (to the 5 volts of the power supply voltage Vcc). Junction V then has a pushed up voltage of 10.0 volts (the sum of the 5 volt new reference plus the stored voltage 5.0 volts of C2). However, junction V remains connected through Q8 to junction III, so that at equilibrium the reference voltage at junction III for capacitor device C2 is very nearly 10.0 volts, thus through C1 pushing up the voltage at junction I to approximately 15 volts (10.0 volt reference plus 5.0 volt stored voltage of C1). This 15 volts of junction I is fed through Q2 to junction II to be applied as a 15 volt overdrive voltage to the gate of Q8, which is already receiving 10.0 volts at its drain from C2.

It should be noted that in the described operation the capacitor devices C1 and C2 are connected in series (through the path Q5, C2, Q8, C1, Q2) so as to cascade their stored voltages with the raised reference to provide the 15 volt drive to the gate of Q8. It should also be noted that the power supply for transistor Q8 and for transistor Q2 is now, to all intents and purposes, the bootstrap capacitor devices C2 and C1 because Q1 and Q7 are shut off, severing the normal connection the Vcc.

Recapitulating, at equilibrium, the drain of Q8 is supplied 10.0 volts (by push up from Vcc through C2), and the gate of Q8 is overdriven at 15 volts (by push up from Vcc through C1 and C2 connected in series). Transistor Q8 then has sufficient gate drive voltage to conduct strongly between junction V and the gate of Q9 so as to transmit and apply approximately the full 10.0 volts to the gate of Q9.

Because 10.0 volts is applied to the gate of the output transistor Q9, transistor Q9 (whose drain is supplied 5 volts from Vcc) has sufficient fast rising gate overdrive to rapidly transmit and apply substantially the full 5 volt value of Vcc to output terminal 14 during the low level of the input signal to drive circuit 10.

Whenever the input signal at the input terminal 12 returns to a relatively high voltage value, circuit 10 returns to its "off" or quiescent state, and the bootstrap capacitor devices C1 and C2 are recharged as before. Further, since in the "off" state the only current path from Vcc to ground is through transistors Q1, Q2, and Q3, the power dissipation is then quite low and certainly at acceptable levels for this type of equipment.

With the double, bootstrapped feedback with switched depletion devices providing the starting charging voltage to the capacitor device, the supply and gate drive voltages are very fast rising at the output stage and are very much higher than the voltage available from the 5 volt power supply.

Note the use of one bootstrapped capacitor device C2 to raise the power supply voltage to Q8, while Q8 at the same time acts as a switch to place both capacitor devices C2 and C1 in series with the gate of Q8 to overdrive itself. With switched depletion mode charging of C1 and C2, the uniqueness of this arrangement is further compounded and rendered unique by the fact that Q8 also acts as an intermediate coupling switch to couple C2 to the gate of the final drive transistor Q9 to insure an adequate gate drive to Q9. The fact that internal voltages are very rapidly substantially doubled and tripled by judicious cascading in this manner of the switched depletion device charged bootstrap capacitor devices, enables a reliable and rugged supply voltage which can be used to drive the various access lines of a semiconductor memory without the need for external clocks. Further, this circuitry utilizes a minimum number of devices to achieve efficiency and high speed-to-power ratio.

We have noted before that in FIG. 1 the capacitor devices C1 and C2 are shown with the usual capacitor symbols to aid in convenient understanding of the circuit. It should be understood, however, that preferably capacitor devices are utilized which can readily be formed on the substrate surface of a semiconductor memory wafer. A preferred embodiment of capacitor device C1 is shown in FIG. 2a and is seen to comprise a depletion mode field effect transistor C1' whose drain and source are connected together so that drain, source, and the normally conductive channel therebetween constitute one node of the effective capacitor, and the gate of C1' is the other node of the effective capacitor. FIG. 2b shows a similar preferred embodiment C2' of capacitor device C2. Other types of semiconductor effective capacitors may also be utilized, as for example, devices which utilize the diffusion to substrate capacitance.

What is claimed is:

1. A drive circuit operable in response to applied first and second signals to supply to an output terminal a signal of predetermined potential substantially equal to a supply potential, said drive circuit comprising:
   a first charging circuit including a first capacitor and a first switchable depletion mode field effect device selectively switchable conductive for charging said first capacitor to the supply potential;
   a second charging circuit including a second capacitor and a second switchable depletion mode field effect device selectively switchable conductive for charging said second capacitor to the supply potential;
   an output circuit, including an output field effect device switch receiving the supply potential and drivable for coupling the supply potential to the output terminal; and
   a control circuit coupled to said first and second charging circuits, said control circuit being responsive to the first signal for switching conductive said first and second switchable depletion mode devices to charge said first and second capacitors to the supply potential, said control circuit being operable in response to the second signal for switching said first and second depletion mode devices non-conductive and for raising the base reference potential of said second capacitor towards the supply potential, said control circuit being further responsive to the second signal for serially interconnecting and cascading said first and second capacitors to apply the combination of their individual potentials and the raised base reference potential to said output circuit for overdriving said output switch with a predetermined portion of the combined potentials to couple substantially the full supply potential to the output terminal.

2. The drive circuit of claim 1 wherein said control circuit applies to said output circuit a combined potential substantially equal to triple the supply potential for overdriving the output switch with a portion of the combined potentials substantially equal to twice the supply potential.

3. The drive circuit of claim 2 wherein said output circuit includes an output field effect transistor having its drain electrode connected to said second capacitor and its source electrode connected to drive said output switch, said control circuit in response to the second signal applying a combined potential substantially equal to triple the supply potential to the gate of said output field effect transistor to render said transistor highly conductive to apply therethrough the combination of the individual potentials of said second capacitor and the raised base reference potential to overdrive said output switch.

4. The drive circuit of claim 1 wherein said control circuit includes a continually resistively conducting depletion mode field effect device connected between said first capacitor and said output circuit to normally maintain a potential difference therebetween which permits said first capacitor to be charged to the supply potential without activating the output circuit.

5. The drive circuit of claim 4 wherein said control circuit in response to the first signal establishes a current path outlet for current passing through said continually resistively conducting depletion mode device and in response to the second signal removes said current path outlet, whereby the potential applied to said output circuit rises in response to the second signal.

* * * * *